US008958264B2

(12) United States Patent
Koike et al.

(10) Patent No.: US 8,958,264 B2
(45) Date of Patent: Feb. 17, 2015

(54) SEMICONDUCTOR INTEGRATED CIRCUIT

(71) Applicant: Panasonic Corporation, Osaka (JP)

(72) Inventors: Tsuyoshi Koike, Shiga (JP); Noriaki Narumi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/044,861

(22) Filed: Oct. 2, 2013

(65) Prior Publication Data
US 2014/0036613 A1 Feb. 6, 2014

Related U.S. Application Data

(63) Continuation of application No. PCT/JP2012/002999, filed on May 8, 2012.

(30) Foreign Application Priority Data

May 12, 2011 (JP) ................ 2011-107080

(51) Int. Cl.
*G11C 8/10* (2006.01)
*H03K 19/096* (2006.01)
*H03K 17/22* (2006.01)

(52) U.S. Cl.
CPC .............. *G11C 8/10* (2013.01); *H03K 19/0963* (2013.01); *H03K 17/223* (2013.01)
USPC .................................................. 365/230.06

(58) Field of Classification Search
CPC ..... G11C 8/06–8/10; G11C 8/18; G11C 8/20; G11C 11/4082–11/4087
USPC .................................................. 365/230.06
See application file for complete search history.

(56) References Cited

U.S. PATENT DOCUMENTS

| 6,002,292 | A | * | 12/1999 | Allen et al. | 327/379 |
| 6,873,188 | B2 | * | 3/2005 | Belluomini et al. | 326/98 |
| 7,034,576 | B2 | * | 4/2006 | Levy et al. | 326/98 |
| 7,429,880 | B2 | * | 9/2008 | Rana et al. | 326/98 |
| 2003/0197530 | A1 | | 10/2003 | Tamura | |
| 2007/0080720 | A1 | | 4/2007 | Masuo et al. | |
| 2007/0176640 | A1 | | 8/2007 | Sasagawa | |

FOREIGN PATENT DOCUMENTS

| JP | 2003-318727 A | 11/2003 |
| JP | 2007-096907 A | 4/2007 |
| JP | 2007-202052 A | 8/2007 |

OTHER PUBLICATIONS

International Search Report issued in International Application No. PCT/JP2012/002999 with Date of mailing Jul. 3, 2013.

* cited by examiner

*Primary Examiner* — Harry W Byrne
*Assistant Examiner* — Lance Reidlinger
(74) *Attorney, Agent, or Firm* — McDermott Will & Emery LLP

(57) ABSTRACT

There are included first and second dynamic circuits and first and second transistors. The first dynamic circuit keeps a first dynamic node at a first level when a plurality of input signals is in a first state, and switches the first dynamic node between the first level and a second level in accordance with a first clock signal when the plurality of input signals is in a second state. The second dynamic circuit includes a compensating circuit that is provided between the second dynamic node and a second power supply and connects the second dynamic node to the second power supply so as to compensate the level of the second dynamic node when the plurality of input signals is in the second state and the first dynamic node is at a level other than the first level.

15 Claims, 15 Drawing Sheets

SEMICONDUCTOR INTEGRATED CIRCUIT

RELATED APPLICATIONS

This application is Continuation Application of International Application No. PCT/JP2012/002999, filed on May 8, 2012, which in turn claims the benefit of Japanese Application No. 2011-107080, filed on May 12, 2011, the disclosures of which are incorporated by reference herein.

BACKGROUND OF THE INVENTION

1. Field of the Invention

The present invention relates to a semiconductor integrated circuit, and particularly relates to a semiconductor integrated circuit including a dynamic circuit.

2. Description of the Related Art

There has been conventionally known a semiconductor memory shown in FIG. 15 as a semiconductor integrated circuit. In the semiconductor memory, word driver 600 selects one of a plurality of word lines WL<0> . . . WL<n> (n is an integer not less than one), and the selected word line is activated so that data in memory cell 610 is outputted to bit lines BIT<0> and NBIT<0>. The data outputted to bit lines BIT<0> and NBIT<0> is amplified by sense amplifier 620 and is externally outputted as output signal DO<0>. Which one of the word lines is selected is determined in accordance with address signal Address and output of row decoder 630. If the output from row decoder 630 includes noise, a plurality of word lines can be possibly selected. When a plurality of word lines are selected, pieces of data outputted from memory cell 610, which is connected to the respective word lines, collide with each other on the bit lines. This leads to erroneous operation of the semiconductor memory.

A row decoder typically includes a dynamic circuit in order to increase outputting speed. The dynamic circuit thus used tends to generate noise in output. In order to reduce noise generated in output from a row decoder, there has been proposed a row decoder including a dynamic circuit, which also includes a holding circuit for holding voltage of an output node (see Unexamined Japanese Patent Publication No. 2003-318727, for example).

SUMMARY OF THE INVENTION

In recent years, along with change in trend of the techniques in a semiconductor memory, there has been adopted a semiconductor memory that can accept to some extent noise generated in output from a decoder. As exemplified in FIG. 16, a semiconductor memory has a hierarchical bit line structure, in which global bit lines GBL<0> and NGBL<0> and local bit lines LBL<0> and NLBL<0> in bank 640 are connected by way of bank selection circuits 650.

This semiconductor memory does not operate erroneously even if non-selected word line WL_BLK1_<0> other than selected word line WL_BNK0_<0> is activated due to noise generated in output from bank decoder 660. Bank selection signal BNK<1> has no noise even when non-selected word line WL_BLK1_<0> is active, so that bank selection circuit 650 does not operate and local bit lines LBL<0> and NLBL<0> connected to a non-selected bank are not connected to global bit lines GBL<0> and NGBL<0>.

The semiconductor memory thus configured accepts noise in output from a decoder to some extent, but still can operate erroneously if the output has an error. It thus seems effective to apply the semiconductor integrated circuit according to Unexamined Japanese Patent Publication No. 2003-318727 to a decoder of a semiconductor memory. The technique according to Unexamined Japanese Patent Publication No. 2003-318727 reduces noise in an output signal, but inhibits increase in speed of the output signal such that the output signal logically transits at later timing or at lower speed. The semiconductor memory thus has problems that data is read out of a memory cell at lower speed, and the like.

In view of the above, it is an object of the present invention to achieve quick removal of noise in an output signal and increase in speed of the output signal in a semiconductor integrated circuit.

In order to achieve the object mentioned above, the present invention proposes the following solution. For example, a semiconductor integrated circuit includes: a first dynamic circuit for receiving a plurality of input signals and a first clock signal and controlling a level of a first dynamic node; a first transistor provided between a second dynamic node and a first power supply, for being conduction controlled in accordance with the level of the first dynamic node; a second transistor provided between the second dynamic node and the first power supply so as to be in series with the first transistor, for being conduction controlled in accordance with a second clock signal; and a second dynamic circuit for outputting an output signal having a logical value corresponding to a level of the second dynamic node. When the plurality of input signals is in a first state, the first dynamic circuit keeps the first dynamic node at a first level where the first transistor is conducted, and yet, when the plurality of input signals is in a second state other than the first state, the first dynamic circuit switches the first dynamic node between the first level and a second level where the first transistor is non-conducted in accordance with the first clock signal. The second dynamic circuit includes a compensating circuit that is provided between the second dynamic node and a second power supply and connects the second dynamic node to the second power supply so as to compensate the level of the second dynamic node when the plurality of input signals is in the second state and the first dynamic node is at a level other than the first level.

In this configuration, when the first and second transistors are conducted, the second dynamic node is connected to the first power supply. The first transistor is non-conducted when the first dynamic node is at a second level. The compensating circuit operates when the plurality of input signals is in the second state and the first dynamic node is at a level other than the first level, and connects the second dynamic node and the second power supply.

Assume that the second dynamic node is at a level indicated by the second power supply and the second transistor is conducted. In this case, if the plurality of input signals is in the second state, the first transistor is conducted until the first dynamic node is completely switched from the first level to the second level. The second dynamic node is thus connected to the first power supply. The second dynamic node accordingly varies in level. In this case, the first dynamic node is at a level between the first level and the second level, so that the compensating circuit operates to compensate the level of the second dynamic node. The second dynamic node shortly recovers to the level prior to the variation. In other words, noise generated due to the variation in level of the second dynamic node is removed in a short period, so that the output signal has no error.

The compensating circuit does not operate when the first and second transistors are conducted and the second dynamic node and the first power supply are connected with each other. In this case, the second dynamic node is not supplied with voltage from the second power supply. The second dynamic node is thus switched from the level indicated by the second power supply to the level indicated by the first power supply in a short period. In other words, the logical value of the output signal transits at earlier timing and at higher speed.

The semiconductor integrated circuit preferably includes a holding circuit that is provided between the first dynamic node and the second power supply so as to keep the first dynamic node at the first level when the first dynamic node is at the first level.

This configuration suppresses slight variation in level of the first dynamic node from the first level due to noise or the like generated at the first dynamic node. The first transistor can be thus conducted stably. The second dynamic node is accordingly varied from the level indicated by the second power supply to the level indicated by the first power supply in a shorter period. This enables further increase in speed of the output signal.

The present invention achieves quick removal of noise in the output signal and increase in speed of the output signal.

DETAILED DESCRIPTION OF THE PREFERRED EMBODIMENTS

First Exemplary Embodiment

Figure 1:
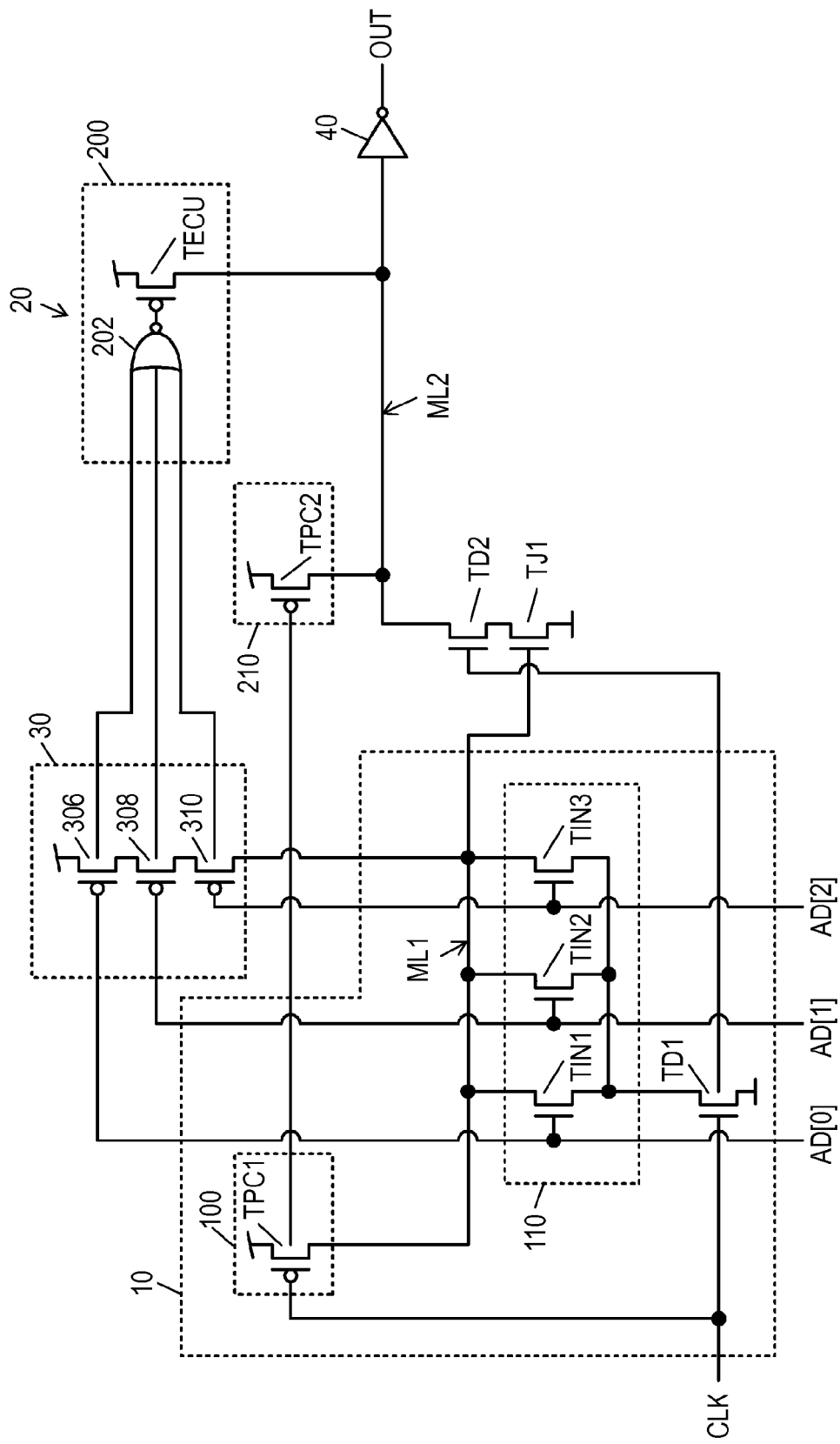
FIG. 1 is a circuit diagram showing a configuration of a semiconductor integrated circuit according to a first exemplary embodiment.

FIG. 1 is a circuit diagram showing a configuration of a semiconductor integrated circuit according to the first exemplary embodiment. The semiconductor integrated circuit shown in FIG. 1 can be an address decoder, and outputs signal OUT having a desired logical value in accordance with a plurality of address signals having received. More specifically, in a state where all of address signals AD[0], AD[1], and AD[2] are LOW (first state), if clock signal CLK varies from LOW to HIGH, output signal OUT varies from LOW to HIGH. In contrast, in a state where one of address signals AD[0], AD[1], and AD[2] is HIGH (second state), output signal OUT is kept LOW. The address decoder includes first dynamic circuit 10, NMOS transistor TJ1 as a first transistor, NMOS transistor TD2 as a second transistor, second dynamic circuit 20, holding circuit 30, and inverter 40.

First dynamic circuit 10 includes first precharge circuit 100 for precharging first dynamic node ML1, NMOS parallel circuit 110, and NMOS transistor TD1.

First precharge circuit 100 is connected between power supply voltage serving as a second power supply and first dynamic node ML1, and includes PMOS transistor TPC1 that is conduction controlled in synchronization with clock signal CLK.

NMOS parallel circuit 110 is connected between first dynamic node ML1 and NMOS transistor TD1, and includes NMOS transistors TIN1, TIN2, and TIN3 that are conduction controlled in accordance with address signals AD[0], AD[1], and AD[2].

NMOS transistor TD1 is connected between NMOS parallel circuit 110 and ground potential serving as a first power supply, and is conduction controlled in synchronization with clock signal CLK.

As described above, in first dynamic circuit 10, in the state where all of address signals AD[0], AD[1], and AD[2] are LOW, first dynamic node ML1 is kept HIGH (first level). In contrast, in the state where one of address signals AD[0], AD[1], and AD[2] is HIGH, first dynamic node ML1 is LOW (second level) if clock signal CLK is HIGH, and is HIGH if clock signal CLK is LOW.

NMOS transistors TJ1 and TD2 are connected in series between second dynamic node ML2 and ground potential. NMOS transistor TJ1 is conduction controlled in accordance with the level of first dynamic node ML1. NMOS transistor TD2 is conduction controlled in synchronization with clock signal CLK. NMOS transistor TJ1 can be alternatively connected between second dynamic node ML2 and NMOS transistor TD2.

Second dynamic circuit 20 includes second dynamic node ML2, compensating circuit 200, and second precharge circuit 210. Compensating circuit 200 can be provided as PMOS transistor TECU that is connected between power supply voltage and second dynamic node ML2 and serves as a third transistor. PMOS transistor TECU is conduction controlled upon reception of results of logical operation by NOR circuit 202 using address signals AD[0], AD[1], and AD[2]. More specifically, PMOS transistor TECU is conducted if one of address signals AD[0], AD[1], and AD[2] is HIGH.

Second precharge circuit 210 precharges second dynamic node ML2 so as to be HIGH. For example, second precharge circuit 210 is provided as PMOS transistor TPC2 that is connected between power supply voltage and second dynamic node ML2 and is conduction controlled in synchronization with clock signal CLK.

Holding circuit 30 can include three PMOS transistors 306, 308, and 310 that are connected in series between power supply voltage and first dynamic node ML1. PMOS transistors 306, 308, and 310 as fifth transistors are conduction controlled in accordance with address signals AD[0], AD[1], and AD[2], respectively. PMOS transistors 306, 308, and 310 can be connected in series. The fifth transistors can be alternatively provided as one PMOS transistor. In this case, output from the NOR circuit, which receives address signals AD[0], AD[1], and AD[2], can be received at the gate of the PMOS transistor.

Inverter 40 outputs output signal OUT having a logical value obtained by inverting the level of second dynamic node ML2.

Operation of the address decoder shown in FIG. 1 is described next with reference to FIG. 2. Assume that one of address signals AD[0], AD[1], and AD[2] is HIGH from time t0 to time t2 and all of address signals AD[0], AD[1], and AD[2] are LOW in the remaining period. In other words, the addresses are missed from time t0 to time t2 and the addresses are hit from time t2.

All NMOS transistors TIN1, TIN2, and TIN3 are non-conducted until time t0. Clock signal CLK is LOW until time t0, so that NMOS transistors TD1 and TD2 are non-conducted and PMOS transistors TPC1 and TPC2 are conducted. Both of first and second dynamic nodes ML1 and ML2 are thus precharged to be HIGH. Output signal OUT is accordingly LOW. First dynamic node ML1 is kept HIGH, so that NMOS transistor TJ1 is conducted.

When clock signal CLK varies to HIGH at time t0, NMOS transistor TD1 is conducted. One of NMOS transistors TIN1, TIN2, and TIN3 are conducted at time t0. First dynamic node ML1 is thus discharged from HIGH to LOW. NMOS transistor TD2 is conducted substantially simultaneously therewith, so that second dynamic node ML2 starts to be discharged. In this case, electric charge of second dynamic node ML2 is extracted and second dynamic node ML2 is thus varied to be LOW and generates noise. This leads to noise in output signal OUT.

When first dynamic node ML1 varies from HIGH to LOW, NMOS transistor TJ1 turns to be non-conducted and discharge of second dynamic node ML2 thus stops. One of address signals AD[0], AD[1], and AD[2] are HIGH from time t0 to time t2, so that compensating circuit 200 supplies power supply voltage to second dynamic node ML2. In this case, second dynamic node ML2 is compensated to shortly recover to HIGH, and noise is accordingly cancelled in a short period. In other words, output signal OUT is never erroneous even if second dynamic node ML2 generates noise.

When clock signal CLK is LOW at time t1, NMOS transistors TD1 and TD2 are non-conducted. In this case, both of first and second dynamic nodes ML1 and ML2 are kept HIGH.

If all of address signals AD[0], AD[1], and AD[2] are LOW at time t2, all of NMOS transistors TIN1, TIN2, and TIN3 are non-conducted. NMOS transistor TD2 is conducted in this case, so that second dynamic node ML2 starts to be discharged. All of address signals AD[0], AD[1], and AD[2] are LOW in this case, and compensating circuit 200 is thus not in operation. Second dynamic node ML2 is smoothly discharged and thus varies to LOW shortly. Accordingly, output signal OUT logically transits at earlier timing and at higher speed. Thereafter, second dynamic node ML2 and output signal OUT logically transits in accordance with clock signal CLK as long as the addresses are hit.

Figure 3:
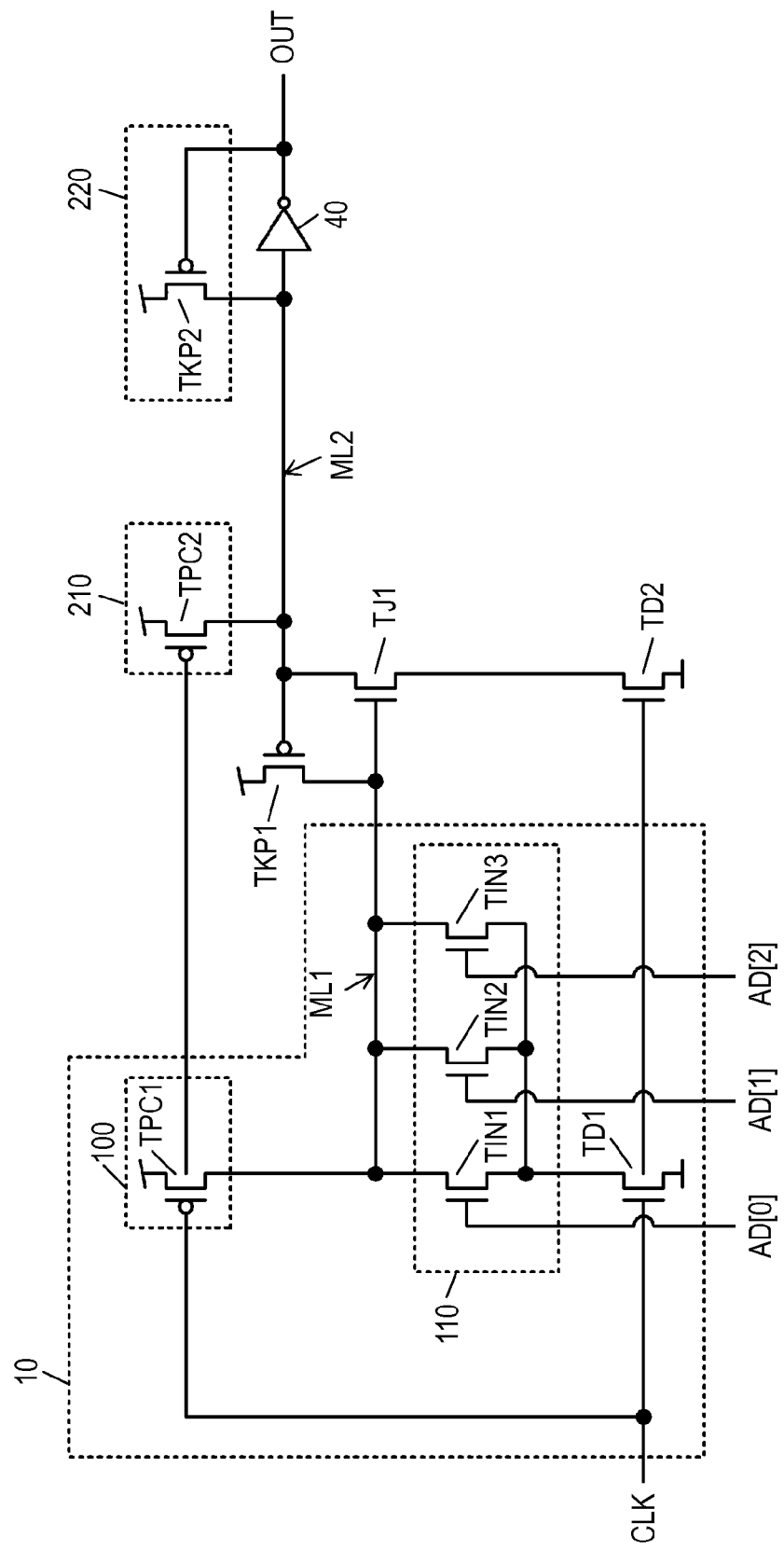
FIG. 3 is a circuit diagram showing a semiconductor integrated circuit according to a comparative example of the first exemplary embodiment.

FIG. 3 is a circuit diagram showing a configuration of an address decoder according to a comparative example of the semiconductor integrated circuit shown in FIG. 1. The common reference signs in FIGS. 1 and 3 denote the identical components, respectively, and these components are not described repeatedly.

NMOS transistor TKP1 in FIG. 3 corresponds to holding circuit 30 in FIG. 1. In the configuration of FIG. 3, NMOS transistors TJ1 and TD2 are connected in the order reverse to that in the configuration of FIG. 1. Furthermore, in the configuration of FIG. 3, compensating circuit 200 shown in FIG. 1 is replaced with holding circuit 220 for holding the level of second dynamic node ML2. Holding circuit 220 is configured similarly to the circuit included in the configuration disclosed in Unexamined Japanese Patent Publication No. 2003-318727, and is provided for reducing noise generated at second dynamic node ML2. More specifically, holding circuit 220 is provided as PMOS transistor TKP2 that is connected between power supply voltage and second dynamic node ML2, and is conduction controlled in accordance with output from inverter 40. Advantageous effects in the configuration of FIG. 1 due to these differences are to be described later.

The address decoder shown in FIG. 3 includes PMOS transistor TKP2 large in size, and is thus capable of further reducing noise generated at second dynamic node ML2. Operation of the address decoder including PMOS transistor TKP2 large in size is described with reference to FIG. 4. Assume that, in FIG. 4, the states of address signals AD[0], AD[1], and AD[2] and timing of logical transition of clock signal CLK are similar to those of FIG. 2.

Clock signal CLK is LOW until time t0, so that both of first and second dynamic nodes ML1 and ML2 are precharged to be HIGH. Output signal OUT is accordingly LOW. Both of PMOS transistor TKP2 and NMOS transistor TJ1 are conducted.

When clock signal CLK varies to HIGH at time t0, both of first and second dynamic nodes ML1 and ML2 are discharged. Second dynamic node ML2 is discharged until first dynamic node ML1 varies to LOW. Second dynamic node ML2 is, however, varied slightly because PMOS transistor TKP2 is conducted. When first dynamic node ML1 varies to LOW and NMOS transistor TJ1 turns to be non-conducted, discharge of second dynamic node ML2 stops and second dynamic node ML2 recovers to the original level. Second dynamic node ML2 slightly varies in level with no inversion in this manner, so that output signal OUT has no noise.

When clock signal CLK varies to LOW at time t1, NMOS transistors TD1 and TD2 are non-conducted. In this case, first dynamic node ML1 varies to HIGH whereas second dynamic node ML2 is kept HIGH. Holding circuit 220 keeps operating because second dynamic node ML2 is HIGH.

When all of NMOS transistors TIN1, TIN2, and TIN3 turn to be non-conducted and clock signal CLK varies to HIGH at time t2, second dynamic node ML2 starts to be discharged. PMOS transistor TKP2 is conducted in this case, so that it takes long time to extract electric charge of second dynamic node ML2. In other words, in comparison to the configuration of FIG. 1, output signal OUT logically transits at later timing and at lower speed. If a semiconductor memory includes the address decoder shown in FIG. 3, data is read out at low speed, for example.

In a case where the address decoder of FIG. 3 operates at low voltage, if PMOS transistor TKP2 is large in size, second dynamic node ML2 possibly has no inversion in level to operate erroneously from time t2.

The address decoder shown in FIG. 3 including large PMOS transistor TKP2 has the problem as described above.

Operation of the address decoder shown in FIG. 3 including small PMOS transistor TKP2 is described with reference to FIG. 5. It is noted that, in FIGS. 4 and 5, each of address signals AD[0], AD[1], and AD[2] and clock signal CLK logically transits at same timing.

When clock signal CLK varies to HIGH at time t0, second dynamic node ML2 starts to be discharged. Power supply voltage is supplied to second dynamic node ML2 by way of PMOS transistor TKP2 while second dynamic node ML2 is HIGH. Second dynamic node ML2 shortly varies to LOW because PMOS transistor TKP2 is small in size. When second dynamic node ML2 is LOW, PMOS transistor TKP2 turns to be completely non-conducted. In this case, second dynamic node ML2 cannot recover to HIGH. More specifically, the level of second dynamic node ML2, which should be essentially kept HIGH, is kept low for a certain period, so that output signal OUT is kept HIGH to be erroneous.

When clock signal CLK varies to HIGH again at time t2, second dynamic node ML2 is discharged. In this case, second dynamic node ML2 relatively shortly varies to LOW because PMOS transistor TKP2 is small in size and capacity. Output signal OUT is thus relatively increased in speed in comparison to the case of FIG. 4.

When the address decoder of FIG. 3 includes small PMOS transistor TKP2, output signal OUT is erroneous. If first dynamic node ML1 in the configuration of FIG. 3 has large load capacity, its timing chart is similar to that shown in FIG. 5.

As described above, in the address decoder of FIG. 3 according to the technique of Unexamined Japanese Patent Publication No. 2003-318727, noise reduction inhibits increase in speed of output signal OUT whereas increase in speed of output signal OUT leads to erroneous output. These problems have trade-off relationship.

In contrast, in the address decoder according to the present embodiment, output signal OUT is not erroneous while having noise and can also be increased in speed, as described above. In other words, the address decoder according to the present embodiment does not have the problems in the trade-off relationship, and is thus particularly suitable for the semiconductor memory shown in FIG. 16, which does not have any noise care means.

The address decoder shown in FIG. 1 can be alternatively provided with holding circuit 220 shown in FIG. 3. The address decoder of FIG. 3 needs holding circuit 220 for recovering the level of second dynamic node ML2 to HIGH after second dynamic node ML2 varies to LOW when one of address signals AD[0], AD[1], and AD[2] is HIGH. In contrast, the address decoder of FIG. 1 is not necessarily provided with holding circuit 220 of FIG. 3 because compensating circuit 200 compensates the level of second dynamic node ML2 when one of address signals AD[0], AD[1], and AD[2] is HIGH.

Address signals AD[0], AD[1] and AD[2] to be received by a semiconductor memory are typically latched by a latch circuit. Address signals AD[0], AD[1], and AD[2] not being latched can be alternatively used as in the present embodiment. In this case, timing of a falling edge of output signal OUT can be adjusted with address signals AD[0], AD[1], and AD[2], so that output signal OUT can be adjusted in pulse width.

In the present embodiment, compensating circuit 200 suppresses noise in output signal OUT to the degree of a glitch, and thus NMOS transistor TD2 can be increased in gate width and can have lower threshold voltage. These enables increase in operating current of NMOS transistor TD2, so that output signal OUT can be further increased in speed.

Compensating circuit 200 reliably compensates the level of second dynamic node ML2. Second dynamic node ML2 can be thus decreased in voltage to a certain degree before NMOS transistor TD2 is conducted to operate. Electric charge to be extracted from second dynamic node ML2 is accordingly decreased in amount, and output signal OUT can be further increased in speed. When PMOS transistor TPC2 is connected with low power supply voltage and second dynamic node ML2 is preliminarily precharged to low voltage, electric charge for charging and discharging of second dynamic node ML2 is decreased in amount, so that reduction in power consumption is achieved.

In FIG. 1, clock signal CLK received by each of NMOS transistors TD1 and TD2 are not necessarily identical with clock signal CLK received by each of PMOS transistors TPC1 and TPC2. Clock signals CLK can be alternatively outputted from different clock generating circuits, for example.

In the configuration of FIG. 3, PMOS transistor TKP1 serving as a holding circuit is connected to second dynamic node ML2. In contrast, holding circuit 30 is not connected to second dynamic node ML2 in the configuration of FIG. 1. The configuration of FIG. 1 can accordingly reduce load capacity of second dynamic node ML2 in comparison to the configuration of FIG. 3. Second dynamic node ML2 can thus logically transit from HIGH to LOW at higher speed.

PMOS transistor TKP1 in the configuration of FIG. 3 tends to be influenced by noise of second dynamic node ML2, and can operate erroneously depending on noise generated at second dynamic node ML2. If second dynamic node ML2 has noise, PMOS transistor TKP1 can be possibly turned ON and first dynamic node ML1, which should be essentially kept LOW, can possibly vary to HIGH. In contrast, holding circuit 30 in the configuration of FIG. 1 is conduction controlled with address signals AD[0], AD[1], and AD[2], and is not influenced by noise of second dynamic node ML2. The configuration of FIG. 1 thus reduces possibility of erroneous operation as described above. In other words, output signal OUT is enhanced in reliability.

In a case where all of address signals AD[0], AD[1], and AD[2] are LOW and first dynamic node ML1 needs to be kept HIGH, the configuration of FIG. 1 further prevents coupling noise and the like generated at first dynamic node ML1 in comparison to the configuration of FIG. 3. NMOS transistor TJ1 can be stably kept HIGH at its gate, and second dynamic node ML2 can thus quickly vary from HIGH to LOW.

In the configuration of FIG. 1, NMOS transistor TD2 conduction controlled with clock signal CLK is located closer to second dynamic node ML2 in comparison to NMOS transistor TD2 shown in FIG. 3. Second dynamic node ML2 can thus quickly vary in level when clock signal CLK varies from LOW to HIGH, and output signal OUT can be increased in speed.

In a case where first dynamic node ML1 has large load capacity in the configuration of FIG. 3, if NMOS transistor TD2 is conducted, first dynamic node ML1, which should be LOW, is unlikely to be LOW. In this case, second dynamic node ML2 generates large noise and PMOS transistor TKP2 in holding circuit 220 is completely non-conducted to operate erroneously. In other words, output signal OUT is erroneous.

Figure 2:
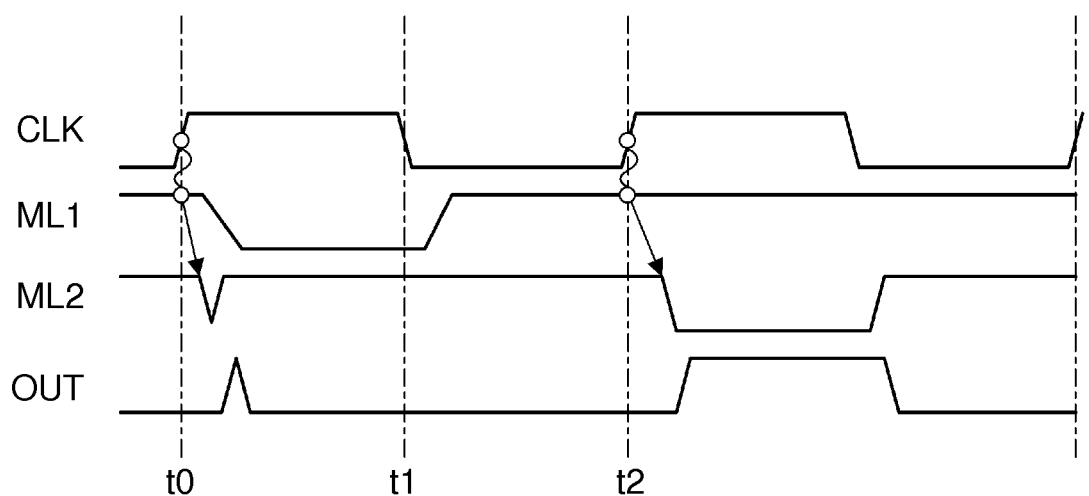
FIG. 2 is a timing chart indicating operation of the semiconductor integrated circuit according to the first exemplary embodiment.

In contrast, even when second dynamic node ML2 in the configuration of FIG. 1 generates large noise, the noise is removed shortly as indicated in FIG. 2. First dynamic node ML1 is thus capable of including many logic circuits, and the semiconductor integrated circuit can be reduced in scale and logical stages can be reduced in number. It is accordingly possible to achieve reduction in area, increase in operation speed, and reduction in power consumption of the address decoder at the same time.

Figure 4:
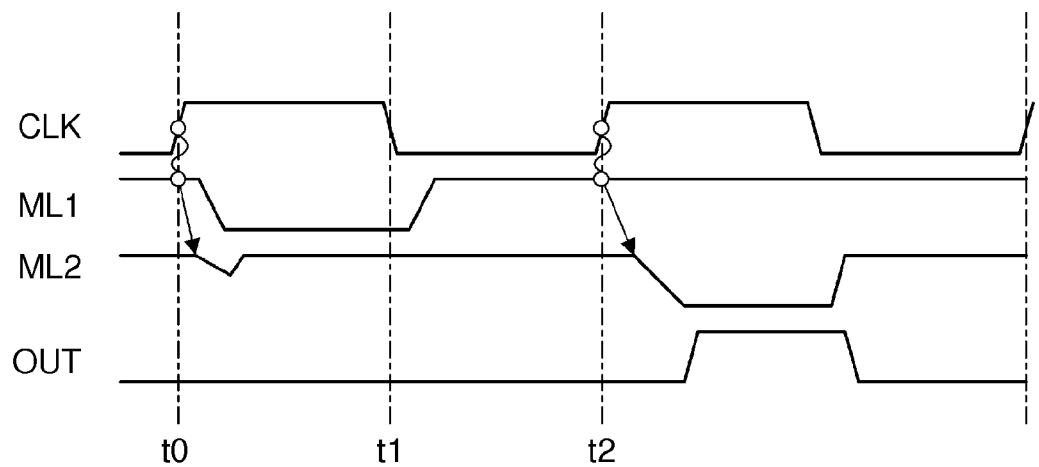
FIG. 4 is a timing chart indicating operation of the semiconductor integrated circuit shown in FIG. 3.
Figure 5:
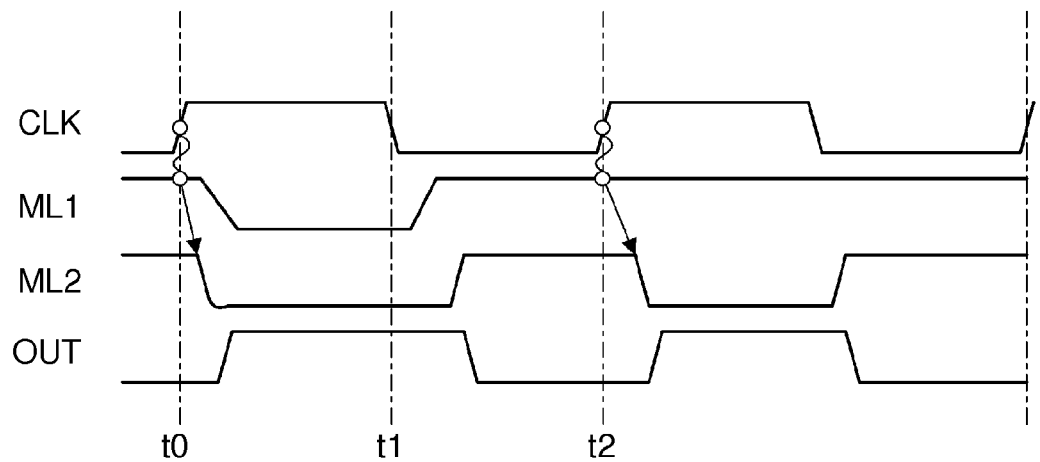
FIG. 5 is a timing chart indicating different operation of the semiconductor integrated circuit shown in FIG. 3.

Holding circuit 220 in the configuration of FIG. 3 operates while second dynamic node ML2 is HIGH, more specifically, from time t0 to time t2 and partially in the period from time t2 in FIG. 4. In contrast, compensating circuit 200 in the configuration of FIG. 1 operates if one of address signals AD[0], AD[1], and AD[2] is HIGH. More specifically, compensating circuit 200 shown in FIG. 1 operates from time t0 to time t2 in FIG. 2 when first dynamic node ML1 is not HIGH. In this case, there is no path of current flowing between ground potential and power supply voltage by way of NMOS transistors TD2 and TJ1, and power consumption can be thus reduced.

The configuration of FIG. 1 includes neither holding circuit 220 shown in FIG. 3 nor any transistor for connecting power supply voltage and second dynamic node ML2 when NMOS transistors TD2 and TJ1 are conducted. This configuration does not cause erroneous operation at low voltage. Operation at lower voltage is enabled during operation at low voltage.

Figure 6:
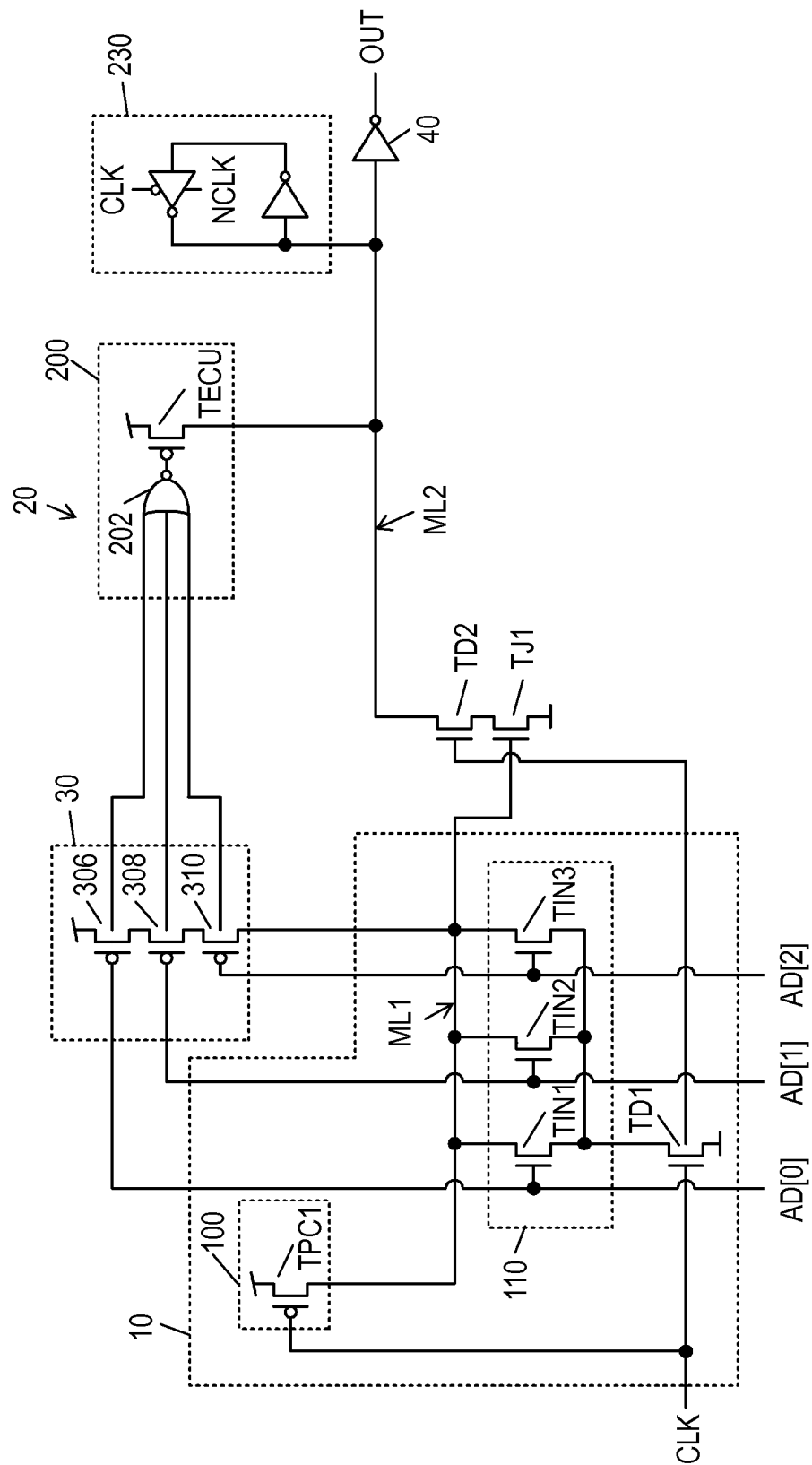
FIG. 6 is a circuit diagram showing a semiconductor integrated circuit according to a modification example of the first exemplary embodiment.

As shown in FIG. 6, second dynamic node ML2 can be connected with latch circuit 230 in place of second precharge circuit 210. In this configuration, latch circuit 230 is capable of holding the level of second dynamic node ML2. The level thus held requires no reset operation for recovering the level of second dynamic node ML2, so that power consumption can be reduced.

Second Exemplary Embodiment

Figure 7:
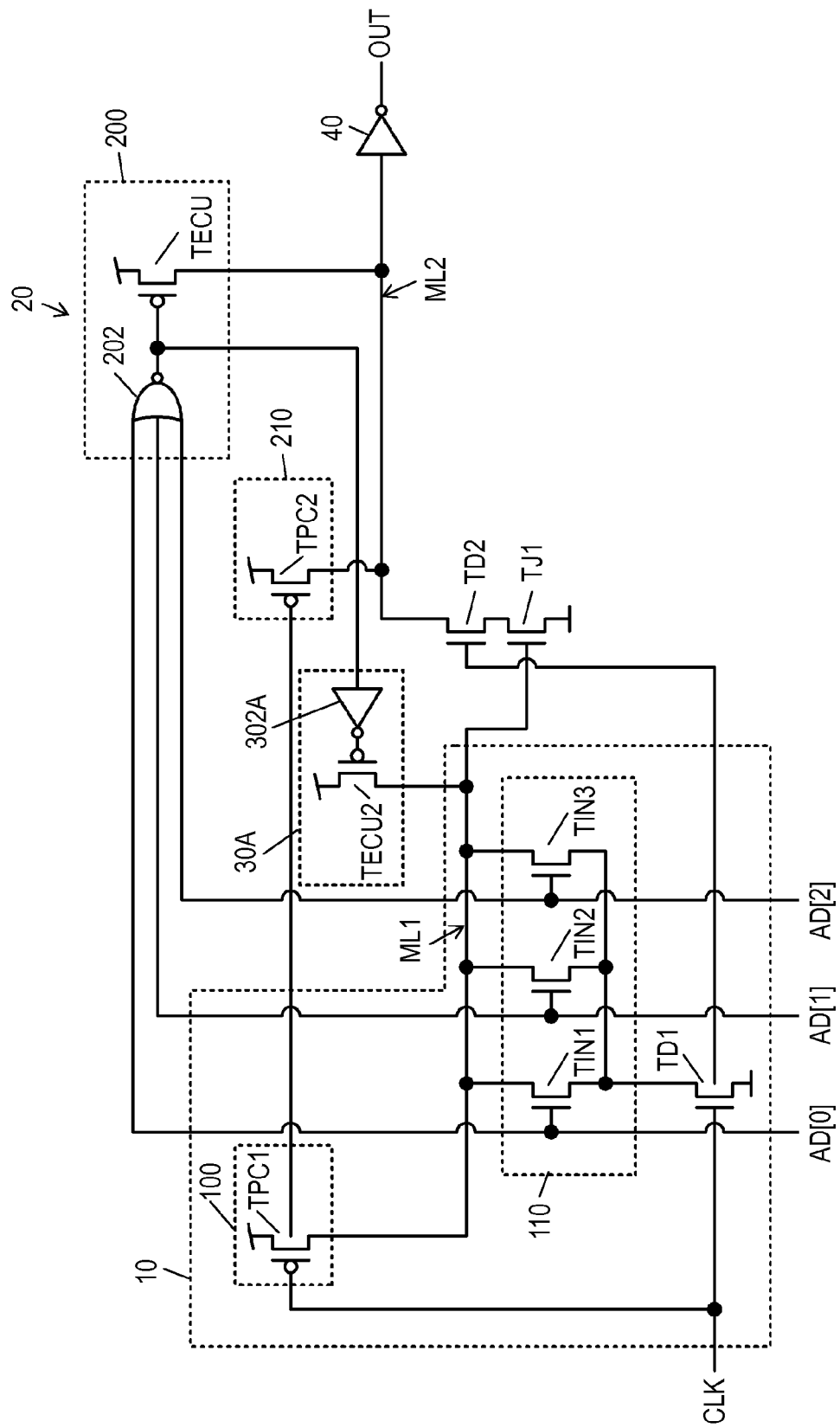
FIG. 7 is a circuit diagram showing a configuration of a semiconductor integrated circuit according to a second exemplary embodiment.

FIG. 7 is a circuit diagram showing a configuration of a semiconductor integrated circuit according to the second exemplary embodiment. The common reference signs in FIGS. 1 and 7 denote the identical components, respectively, and these components are not described repeatedly. FIG. 7 is different from FIG. 1 in that holding circuit 30 in FIG. 1 is replaced with holding circuit 30A and holding circuit 30A is conduction controlled with an input signal to compensating circuit 200.

More specifically, holding circuit 30A can include PMOS transistor TECU2 as a fifth transistor and NOT circuit 302A. PMOS transistor TECU2 is connected between power supply voltage and first dynamic node ML1.

PMOS transistor TECU2 is conduction controlled upon reception of a signal inverted by NOT circuit 302A from an input signal to PMOS transistor TECU. PMOS transistor TECU2 is thus conducted if PMOS transistor TECU is non-conducted.

The present embodiment achieves effects similar to those of the first exemplary embodiment. The configuration according to the present embodiment further reduces load capacity of each of address signals AD[0], AD[1], and AD[2] in comparison to the configuration of FIG. 1.

Third Exemplary Embodiment

Figure 8:
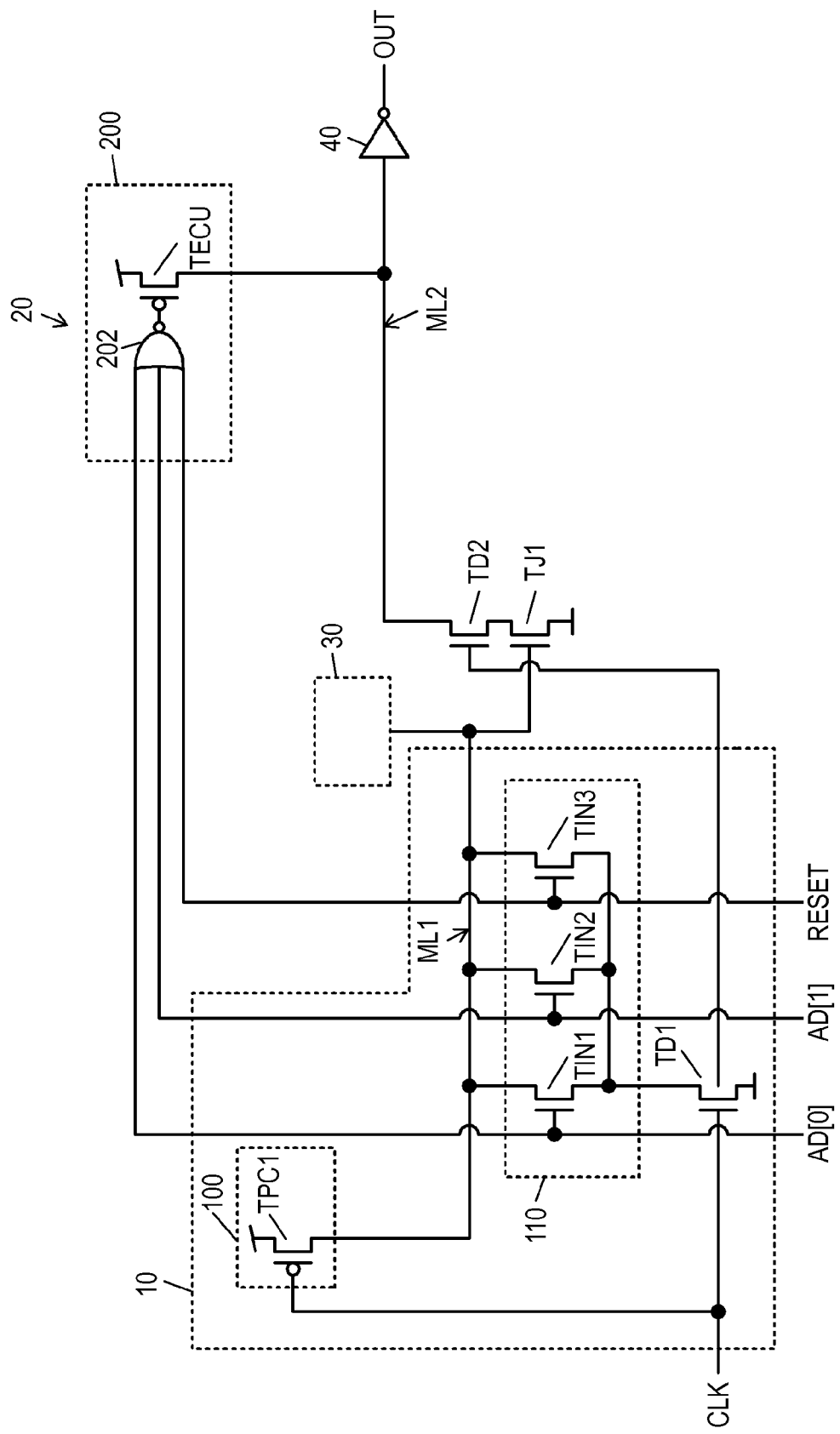
FIG. 8 is a circuit diagram showing a configuration of a semiconductor integrated circuit according to a third exemplary embodiment.

FIG. 8 is a circuit diagram showing a configuration of a semiconductor integrated circuit according to the third exemplary embodiment. The common reference signs in FIGS. 1 and 8 denote the identical components, respectively, and these components are not described repeatedly. The configuration of FIG. 8 is different from the configuration of FIG. 1 in that one of address signals AD[0], AD[1], and AD[2] is replaced with reset signal RESET and second precharge circuit 210 is not included. FIG. 8 depicts holding circuit 30 in FIG. 1 in a simplified manner.

PMOS transistor TECU is conducted if reset signal RESET is active. Reset signal RESET turns to be active at timing where second dynamic node ML2 should be HIGH so as to have an initial value.

As described above, in the present embodiment, second dynamic node ML2 has smaller load capacity and electric charge to be extracted from second dynamic node ML2 is thus decreased in amount. This configuration achieves increase in speed of output signal OUT and reduction in power consumption of the semiconductor integrated circuit. The semiconductor integrated circuit is also reduced in area because second precharge circuit 210 in FIG. 1 is not provided. Clock signal CLK has smaller load capacity due to no provision of second precharge circuit 210, and power consumption can be thus further reduced.

Fourth Exemplary Embodiment

Figure 9:
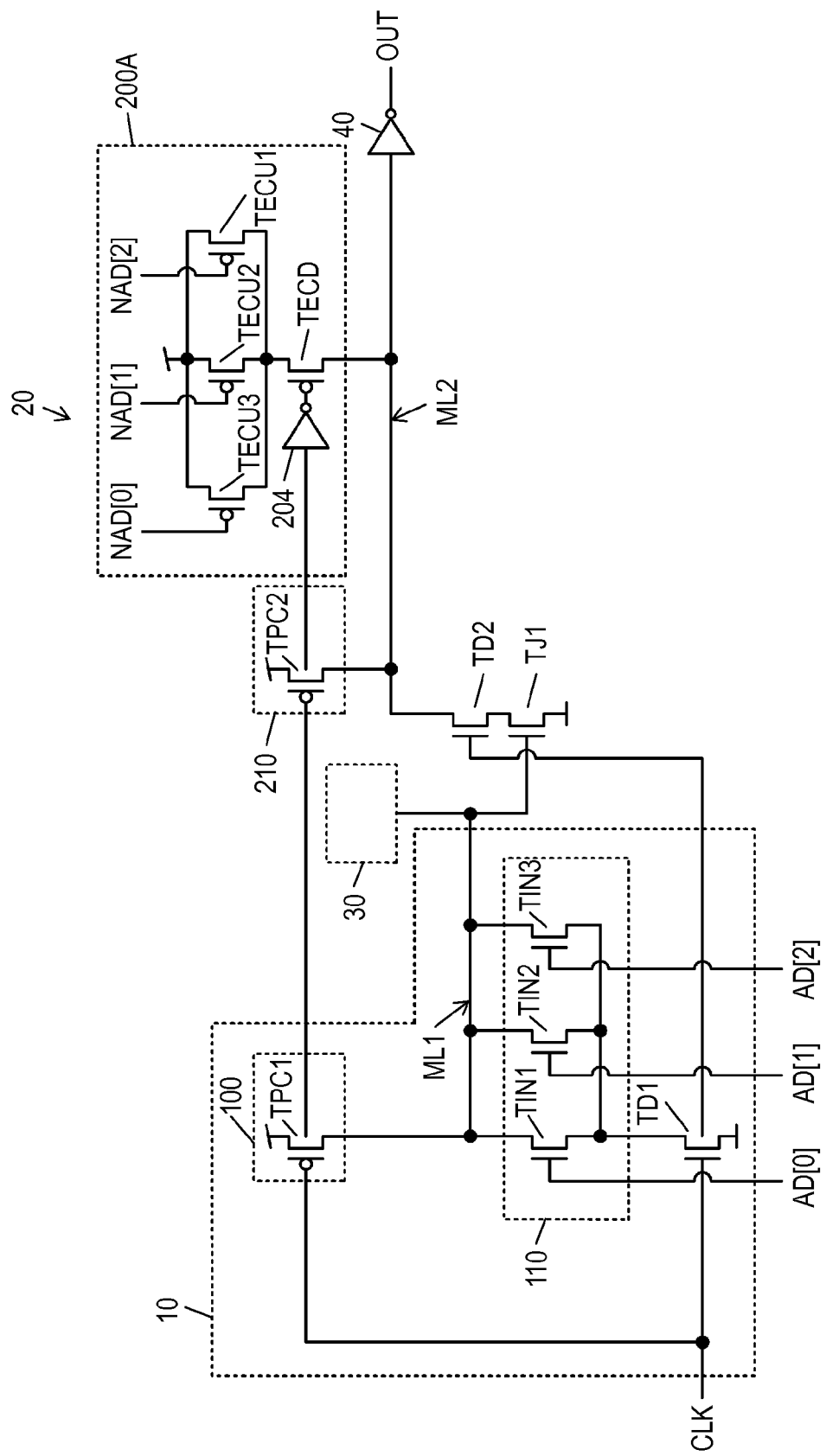
FIG. 9 is a circuit diagram showing a configuration of a semiconductor integrated circuit according to a fourth exemplary embodiment.

FIG. 9 is a circuit diagram showing a configuration of a semiconductor integrated circuit according to the fourth exemplary embodiment. The common reference signs in FIGS. 1 and 9 denote the identical components, respectively, and these components are not described repeatedly. In FIG. 9, compensating circuit 200A is configured differently from compensating circuit 200 in FIG. 1. FIG. 9 depicts holding circuit 30 in FIG. 1 in a simplified manner.

Compensating circuit 200A includes PMOS transistors TECU1, TECU2, and TECU3 connected in parallel, as third transistors.

PMOS transistor TECU1 is conduction controlled upon reception, at its gate, of inversion signal NAD[2] of address signal ANA. PMOS transistor TECU2 is conduction controlled upon reception, at its gate, of inversion signal NAD[1] of address signal AD[1]. PMOS transistor TECU3 is conduction controlled upon reception, at its gate, of inversion signal NAD[0] of address signal AD[0]. An address signal received by a different address decoder can be used as each of inversion signals NAD[0], NAD[1], and NAD[2].

There is thus no need to generate new inversion signals NAD[0], NAD[1], and NAD[2]. Compensating circuit 200A is not increased in area due to the use of inversion signals NAD[0], NAD[1], and NAD[2].

Compensating circuit 200A in FIG. 9 does not need NOR circuit 202 included in compensating circuit 200 in FIG. 1, so that compensating circuit 200A can be reduced in area.

PMOS transistors TECU1, TECU2, and TECU3 in compensating circuit 200A in FIG. 9 are connected to PMOS transistor TECD as a fourth transistor and to second dynamic node ML2 by way of NOT circuit 204. Second dynamic node ML2 can thus have smaller load capacity.

The third transistors can be alternatively provided as one PMOS transistor. In this case, output from an OR circuit, which receives inversion signals NAD[0], NAD[1], and NAD[2], can be received at the gate of the PMOS transistor.

Fifth Exemplary Embodiment

Figure 10:
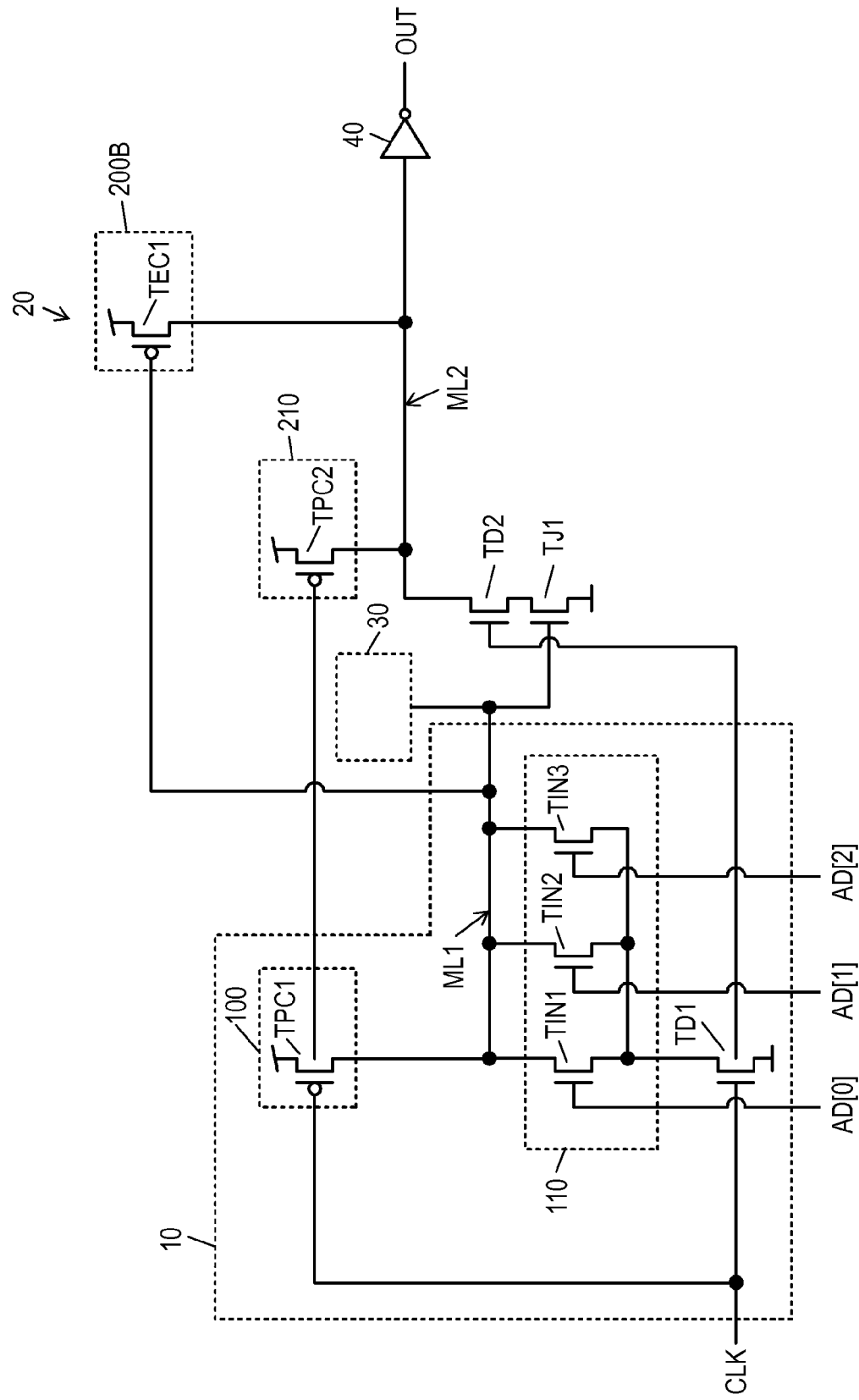
FIG. 10 is a circuit diagram showing a configuration of a semiconductor integrated circuit according to a fifth exemplary embodiment.

FIG. 10 is a circuit diagram showing a configuration of a semiconductor integrated circuit according to the fifth exemplary embodiment. The common reference signs in FIGS. 1 and 10 denote the identical components, respectively, and these components are not described repeatedly. In FIG. 10, compensating circuit 200B is configured differently from compensating circuit 200 in FIG. 1. FIG. 10 depicts holding circuit 30 in FIG. 1 in a simplified manner.

Compensating circuit 200B includes PMOS transistor TEC1 that is connected between power supply voltage and second dynamic node ML2 and serves as a third transistor. PMOS transistor TEC1 has a gate connected with first dynamic node ML1. PMOS transistor TEC1 is thus conducted if one of address signals AD[0], AD[1], and AD[2] is HIGH, in other words, if first dynamic node ML1 is LOW.

As described above, in the present embodiment, compensating circuit 200B can be further simplified in configuration, so that the semiconductor integrated circuit can be further reduced in area.

Even if all of address signals AD[0], AD[1], and AD[2] are LOW and NMOS parallel circuit 110 is non-conducted, electric charge of first dynamic node ML1 can be possibly extracted due to leakage current or the like. In the present embodiment, when electric charge of first dynamic node ML1 is extracted and first dynamic node ML1 varies to LOW, PMOS transistor TEC1 can be possibly turned ON. Holding circuit 30 being provided keeps the level of first dynamic node ML1 HIGH, and prevents PMOS transistor TEC1 from being erroneously turned ON, for example.

In each of the embodiments described above, NMOS transistors TD2 and TJ1 can be connected in the reverse order.

Figure 11:
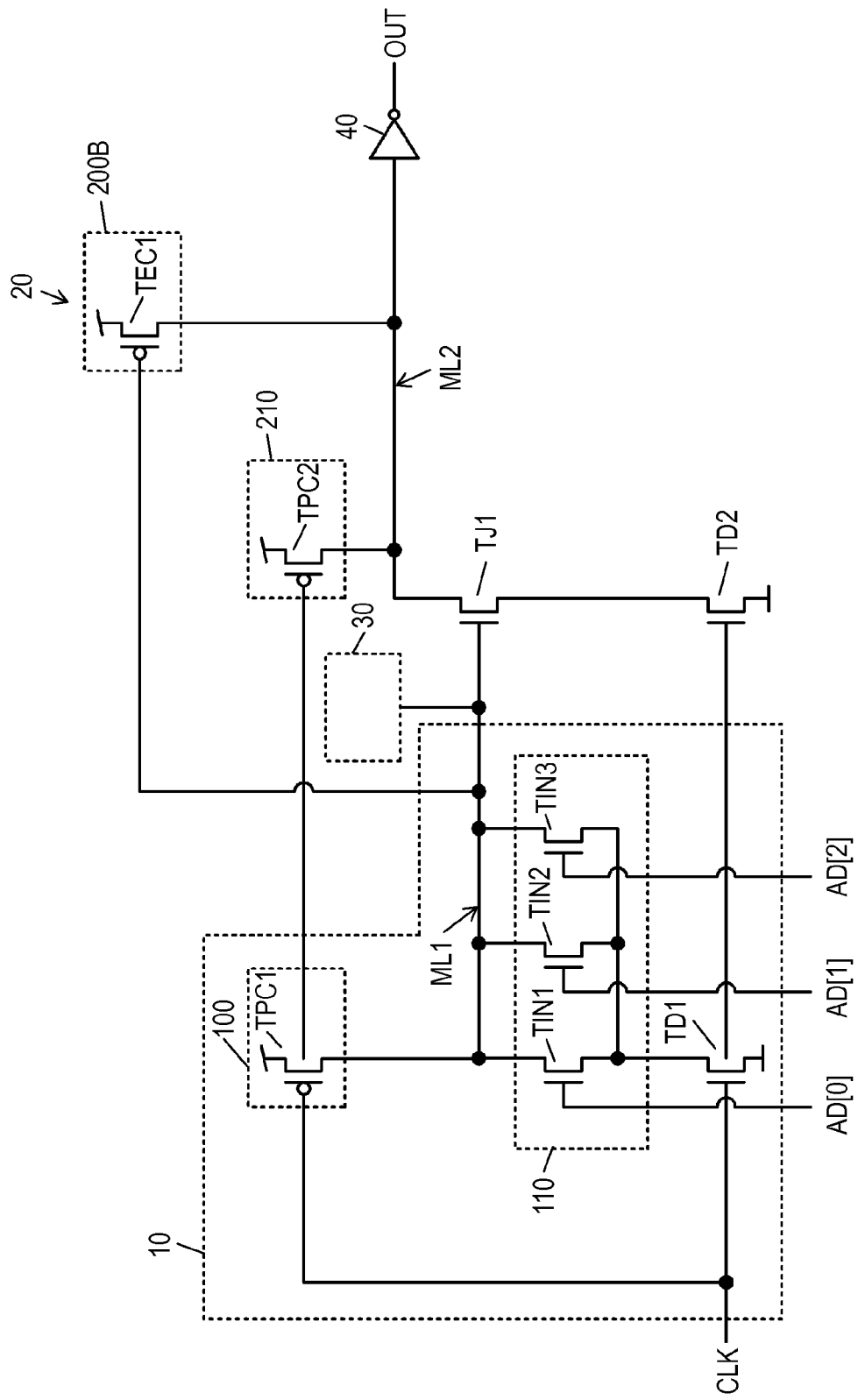
FIG. 11 is a circuit diagram showing a semiconductor integrated circuit according to a modification example of the fifth exemplary embodiment.

As exemplified in FIG. 11, NMOS transistor TJ1 can be alternatively connected between second dynamic node ML2 and NMOS transistor TD2.

Sixth Exemplary Embodiment

Figure 12:
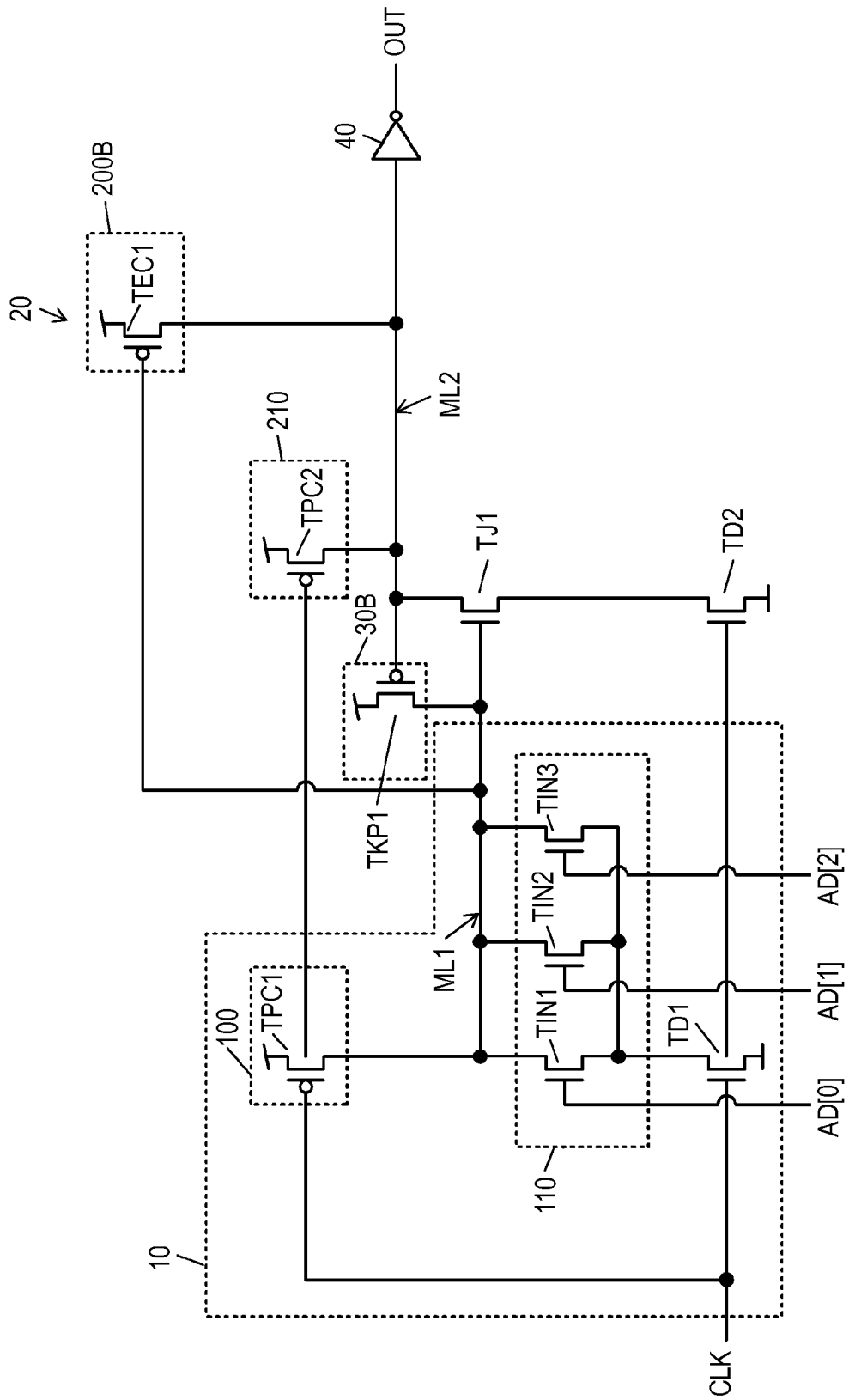
FIG. 12 is a circuit diagram showing a configuration of a semiconductor integrated circuit according to a sixth exemplary embodiment.

FIG. 12 is a circuit diagram showing a configuration of a semiconductor integrated circuit according to the sixth exemplary embodiment. The common reference signs in FIGS. 10 and 12 denote the identical components, respectively, and these components are not described repeatedly. FIG. 12 depicts holding circuit 30B that is configured differently from holding circuit 30 according to each of the embodiments described above.

More specifically, holding circuit 30B can include PMOS transistor TKP1 that is connected between power supply voltage and first dynamic node ML1. PMOS transistor TKP1 is conduction controlled in accordance with the level of second dynamic node ML2, and is conducted if second dynamic node ML2 is LOW.

As described above, in the present embodiment, holding circuit 30B can be further simplified in configuration, so that the semiconductor integrated circuit can be further reduced in area. In the present embodiment, NMOS transistors TJ1 and TD2 can be connected in the reverse order.

Seventh Exemplary Embodiment

Figure 13:
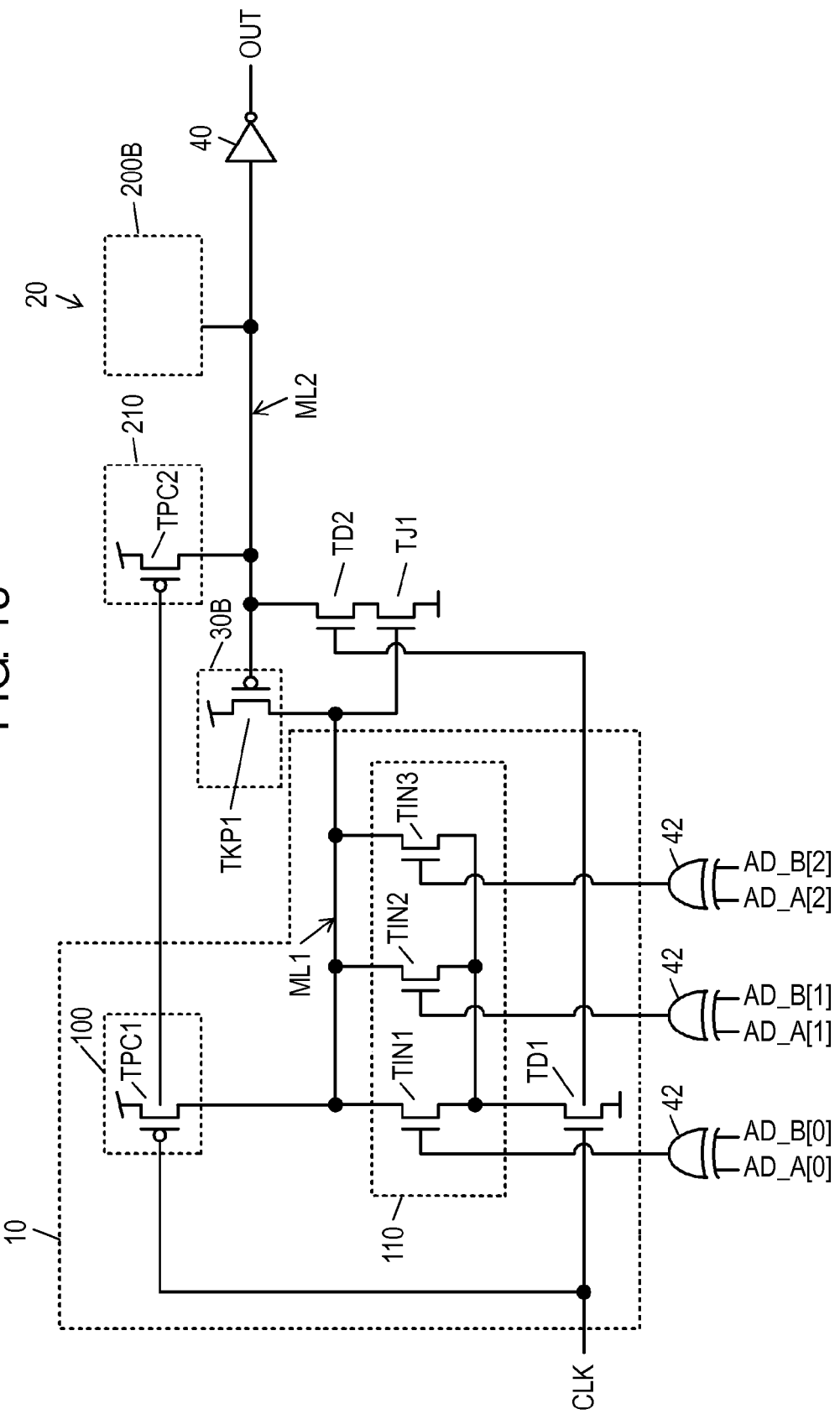
FIG. 13 is a circuit diagram showing a configuration of a semiconductor integrated circuit according to a seventh exemplary embodiment.

FIG. 13 is a circuit diagram showing a configuration of a semiconductor integrated circuit according to the seventh exemplary embodiment. The common reference signs in FIGS. 12 and 13 denote the identical components, respectively, and these components are not described repeatedly. The semiconductor integrated circuit of FIG. 13 can be a comparator for comparing address signals. FIG. 13 depicts compensating circuit 200B in a simplified manner.

The comparator shown in FIG. 13 receives results of logical operation by EOR circuits 42 using address signals AD_A[0] and AD_B[0], AD_A[1] and AD_B[1], and AD_A[2] and AD_B[2], respectively.

An ordinary comparator is not provided with compensating circuit 200B shown in FIG. 13, so that it is necessary to suppress noise in output signal OUT as a result of comparison by the comparator. There is thus conventionally provided a margin at timing of activating a circuit corresponding to NMOS transistor TD2. Such an ordinary comparator hardly achieves increase in speed of output signal OUT.

In contrast, the comparator shown in FIG. 13 is capable of quickly correcting an error in the comparison result or removing noise even when an error occurs or noise is generated at second dynamic node ML2. The comparison results are enhanced in reliability, and there is no need to provide the excessive margin. This leads to increase in speed of output signal OUT.

Figure 14:
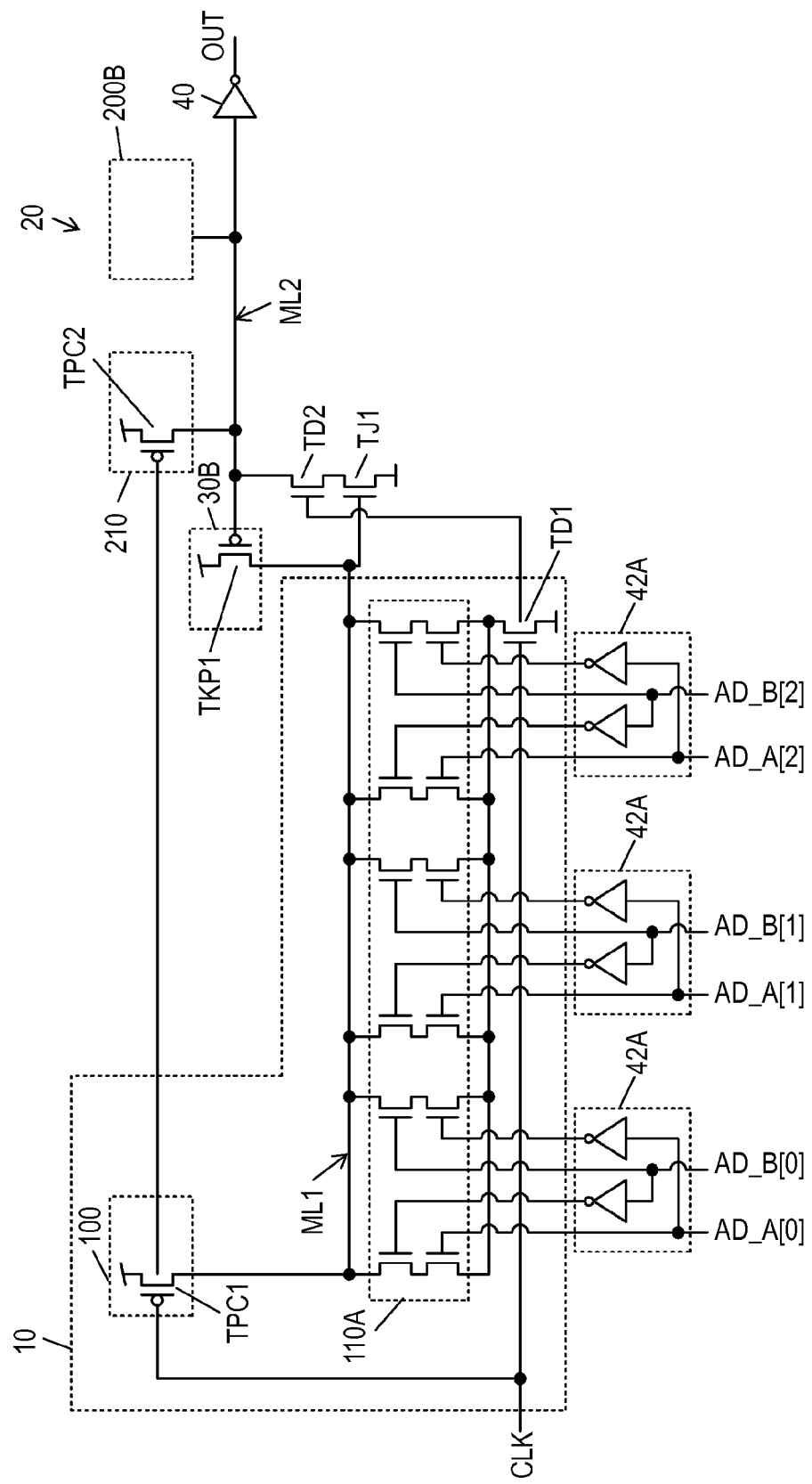
FIG. 14 is a circuit diagram showing a semiconductor integrated circuit according to a modification example of the seventh exemplary embodiment.

The comparator can be alternatively configured as shown in FIG. 14. FIG. 14 shows a comparator according to a modification example of the comparator shown in FIG. 13. FIG. 14 depicts NMOS parallel circuit 110A and logic circuit 42A that are equivalent to NMOS parallel circuit 110 and EOR circuit 42 shown in FIG. 13, respectively.

The number of components in the circuit can be reduced with the comparator shown in FIG. 14 in comparison to the configuration of FIG. 13. The circuit can be thus reduced in area.

The embodiments of the present invention have been described with exemplification of the address decoder and the comparator. The present invention can be configured variously in addition to the above, and can be applicable to various circuits. In these embodiments, NMOS transistors TJ1 and TD2 can be connected in the reverse order.

Furthermore, in these embodiments, each of holding circuits 30, 30A, and 30B may not be included. Ground potential and power supply voltage serve as the first power supply and the second power supply, respectively, in these embodiments. These power supplies can be alternatively replaced with each other. The second state can be established when all of address signals AD[0], AD[1], and AD[2] are LOW, whereas the first state can be established when one of address signals AD[0], AD[1], and AD[2] is HIGH. The second level can correspond to the state where first dynamic node ML1 is HIGH, whereas the first state can correspond to the state where first dynamic node ML1 is LOW. The level of second dynamic node ML2 can be reversely logical to the level described in each of the embodiments. In these cases, the components of the semiconductor integrated circuit according to each of the embodiments can operate in accordance with the logic reverse to that of the operation mentioned above.

The components of the semiconductor integrated circuit according to each of the embodiments can be replaced with an equivalent circuit. For example, NMOS transistor TJ1 can be replaced with a PMOS transistor and an NOT circuit connected to the gate of the PMOS transistor.

Figure 15:
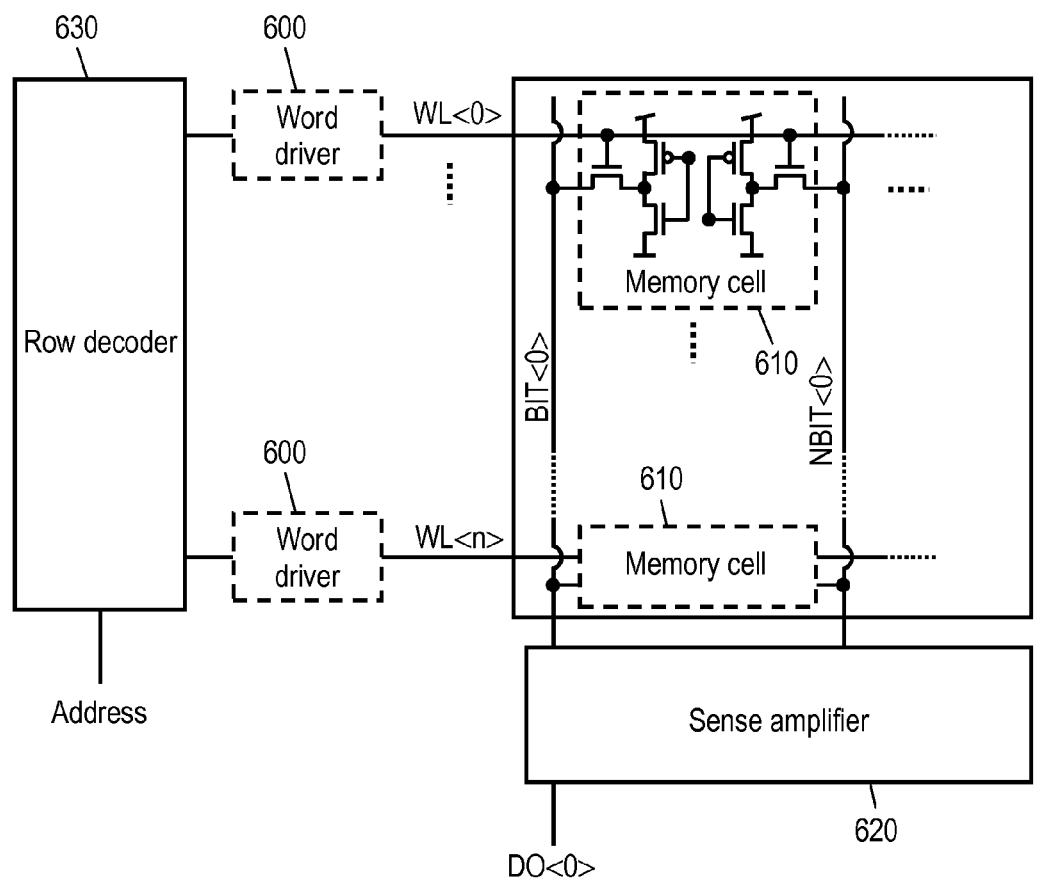
FIG. 15 is a circuit diagram showing a configuration of an ordinary semiconductor memory.
Figure 16:
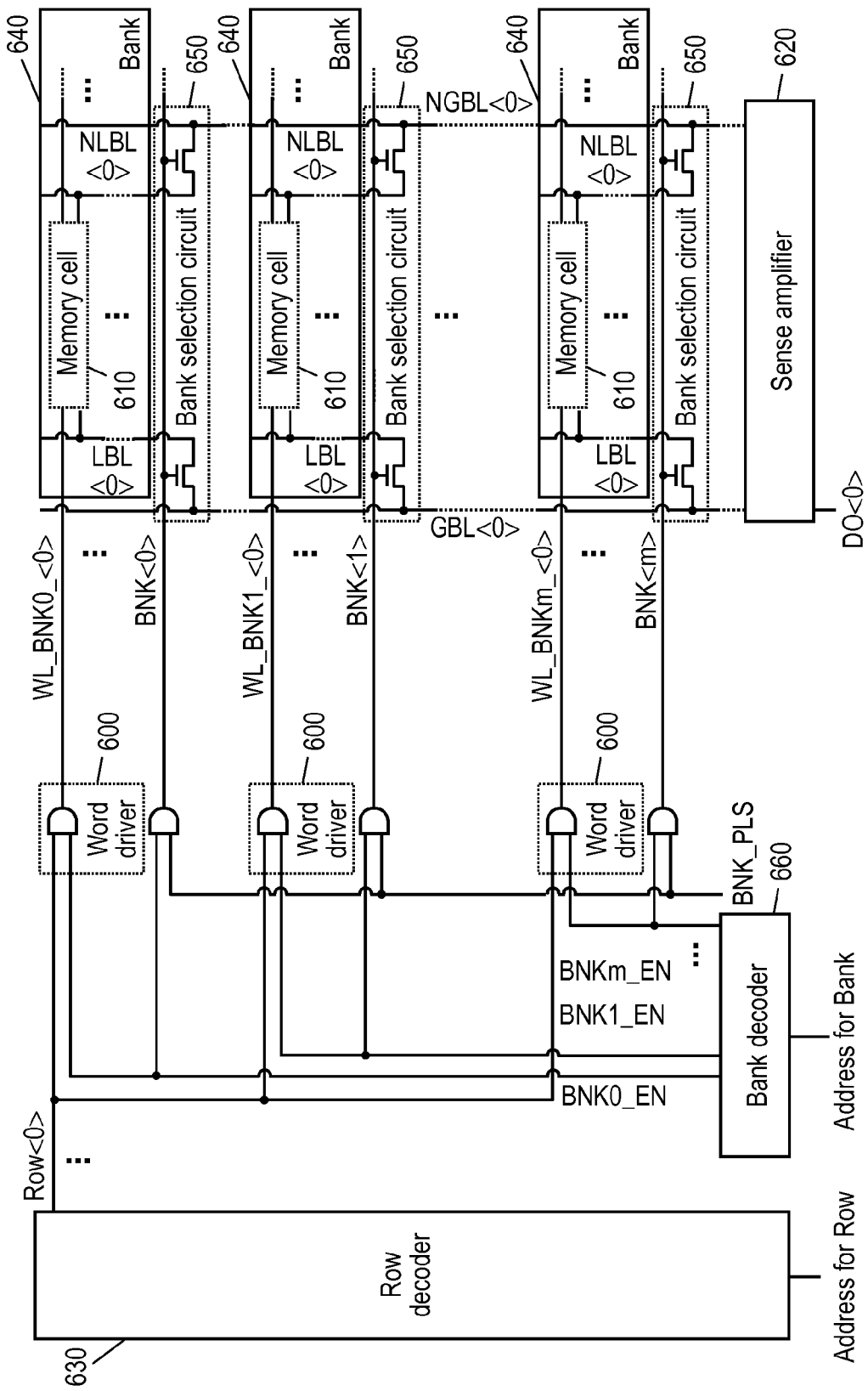
FIG. 16 is a circuit diagram showing a configuration of a semiconductor memory having a hierarchical bit line structure.

The semiconductor integrated circuit according to each of the embodiments is suitable for the semiconductor memory shown in FIG. 16, while it can be applied to the semiconductor memory shown in FIG. 15.

The semiconductor integrated circuit according to the present invention achieves quick removal of noise in an output signal and increase in speed of the output signal, and is thus useful in a semiconductor memory and the like.

What is claimed is:

1. A semiconductor integrated circuit comprising:
   a first dynamic circuit for receiving a plurality of input signals and a first clock signal and controlling a level of a first dynamic node;
   a first transistor provided between a second dynamic node and a first power supply, for being conduction controlled in accordance with the level of the first dynamic node;
   a second transistor provided between the second dynamic node and the first power supply so as to be in series with the first transistor, for being conduction controlled in accordance with a second clock signal; and a second dynamic circuit for outputting an output signal having a logical value corresponding to a level of the second dynamic node;

wherein when the plurality of input signals is in a first state, the first dynamic circuit keeps the first dynamic node at a first level where the first transistor is conducted, and yet, when the plurality of input signals is in a second state other than the first state, the first dynamic circuit switches the first dynamic node between the first level and a second level where the first transistor is non-conducted in accordance with the first clock signal; and wherein the second dynamic circuit includes a compensating circuit that is provided between the second dynamic node and a second power supply and connects the second dynamic node to the second power supply so as to compensate the level of the second dynamic node when the plurality of input signals is in the second state and the first dynamic node is at a level other than the first level.

2. The semiconductor integrated circuit according to claim 1,
wherein the compensating circuit includes a third transistor that is provided between the second dynamic node and the second power supply, is conduction controlled in accordance with the state of the plurality of input signals, and is conducted when the plurality of input signals is in the second state.

3. The semiconductor integrated circuit according to claim 2, further comprising:
a holding circuit including a fifth transistor that is provided between the first dynamic node and the second power supply, is conduction controlled in accordance with an input signal to a gate of the third transistor, and is conducted when the third transistor is non-conducted.

4. The semiconductor integrated circuit according to claim 2,
wherein the plurality of input signals include a reset signal for recovering the second dynamic node to an initial level; and
the third transistor is conducted when the reset signal is active.

5. The semiconductor integrated circuit according to claim 1,
wherein the compensating circuit includes a third transistor that is provided between the second dynamic node and the second power supply, is conduction controlled in accordance with the level of the first dynamic node, and is conducted when the first dynamic node is at the second level.

6. The semiconductor integrated circuit according to claim 1,
wherein the compensating circuit includes a third transistor that is provided between the second dynamic node and the second power supply, is conduction controlled in accordance with a state of inversion signals of the plurality of input signals, and is conducted when the inversion signals are in a state where the plurality of input signals is in the second state.

7. The semiconductor integrated circuit according to claim 6,
wherein the compensating circuit includes a fourth transistor that is provided between the second dynamic node and the second power supply so as to be in series with the third transistor, is conduction controlled in accordance with the first clock signal, and is conducted when the first clock signal is in a state where the first dynamic node is at the second level.

8. The semiconductor integrated circuit according to claim 1, further comprising:
a holding circuit that is provided between the first dynamic node and the second power supply and keeps the first dynamic node at the first level when the first dynamic node is at the first level.

9. The semiconductor integrated circuit according to claim 8,
wherein the holding circuit includes a fifth transistor that is provided between the first dynamic node and the second power supply, is conduction controlled in accordance with the level of the second dynamic node, and is conducted when the second dynamic node is connected to the first power supply.

10. The semiconductor integrated circuit according to claim 8,
wherein the holding circuit includes a fifth transistor that is provided between the first dynamic node and the second power supply, is conduction controlled in accordance with the state of the plurality of input signals, and is conducted when the plurality of input signals is in the first state.

11. The semiconductor integrated circuit according to claim 1,
wherein the second transistor is connected between the second dynamic node and the first transistor.

12. The semiconductor integrated circuit according to claim 1, further comprising:
a latch circuit for latching the level of the second dynamic node.

13. The semiconductor integrated circuit according to claim 1,
wherein the first and second clock signals are identical with each other.

14. The semiconductor integrated circuit according to claim 1,
wherein the semiconductor integrated circuit is an address decoder, and
each one of the plurality of input signals is an address signal.

15. The semiconductor integrated circuit according to claim 1,
wherein the semiconductor integrated circuit is a comparator.

* * * * *